(12) United States Patent
Ho et al.

(10) Patent No.: US 10,211,071 B2
(45) Date of Patent: Feb. 19, 2019

(54) IC PACKAGING METHOD AND A PACKAGED IC DEVICE

(71) Applicant: NXP B.V., Eindhoven (NL)

(72) Inventors: Chung Hsiung Ho, Kaohsiung (TW); Wen-Hsuan Lin, Kaohsiung (TW)

(73) Assignee: NXP B.V., Eindhoven (NL)

( * ) Notice: Subject to any disclaimer, the term of this patent is extended or adjusted under 35 U.S.C. 154(b) by 193 days.

(21) Appl. No.: 15/011,198

(22) Filed: Jan. 29, 2016

(65) Prior Publication Data
US 2017/0221728 A1     Aug. 3, 2017

(51) Int. Cl.
| H01L 21/56 | (2006.01) |
| --- | --- |
| H01L 23/488 | (2006.01) |
| H01L 25/065 | (2006.01) |
| H01L 23/498 | (2006.01) |
| H01L 23/552 | (2006.01) |
| H01L 23/00 | (2006.01) |
| H01L 21/58 | (2006.01) |
| H01L 25/04 | (2014.01) |
| H01L 25/07 | (2006.01) |

(52) U.S. Cl.
CPC .......... *H01L 21/561* (2013.01); *H01L 21/568* (2013.01); *H01L 23/49822* (2013.01); *H01L 23/552* (2013.01); *H01L 24/19* (2013.01); *H01L 24/24* (2013.01); *H01L 24/82* (2013.01); *H01L 24/97* (2013.01); *H01L 25/042* (2013.01); *H01L 25/046* (2013.01); *H01L 25/0655* (2013.01); *H01L 25/072* (2013.01); *H01L 2224/04105* (2013.01); *H01L 2224/12105* (2013.01); *H01L 2224/24247* (2013.01); *H01L 2224/82039* (2013.01); *H01L 2924/14* (2013.01); *H01L 2924/3025* (2013.01)

(58) Field of Classification Search
CPC . H01L 25/042; H01L 25/0655; H01L 25/072; H01L 25/07533; H01L 25/046; H01L 25/0753; H01L 25/11–25/115; H01L 21/02; H01L 21/027; H01L 21/04; H01L 21/50; H01L 21/56; H01L 21/561; H01L 21/568; H01L 2021/60–2021/607; H01L 23/12; H01L 23/28–23/32; H01L 23/48–23/538
See application file for complete search history.

(56) References Cited

U.S. PATENT DOCUMENTS

| 6,586,822 B1 * | 7/2003 | Vu ........................ H01L 23/532 |
| | | 257/678 |
| 7,594,322 B2 * | 9/2009 | Farnworth ............ H01L 21/486 |
| | | 29/830 |

(Continued)

OTHER PUBLICATIONS

International Rectifier datasheet, IRF7169L1TRPbF Device, Feb. 18, 2013.

*Primary Examiner* — Maliheh Malek

(57) ABSTRACT

Embodiments of a method for packaging Integrated Circuit (IC) dies and an IC device are described. In an embodiment, a method for packaging IC dies involves creating openings on a substrate, where side surfaces of the openings on the substrate are covered by metal layers, placing the IC dies into the openings on the substrate, applying a second metal layer to the substrate, where the IC dies are electrically connected to at least a portion of the second metal layer, and cutting the substrate into IC devices.

20 Claims, 23 Drawing Sheets

(56) References Cited

U.S. PATENT DOCUMENTS

| | | | | |
|---|---|---|---|---|
| 7,832,098 B2* | 11/2010 | Hirose | H05K 3/0035 | 216/35 |
| 9,299,651 B2* | 3/2016 | Lin | H01L 23/49816 | |
| 9,425,116 B2* | 8/2016 | Meyer-Berg | H01L 23/12 | |
| 9,466,585 B1* | 10/2016 | Kamphuis | H01L 24/94 | |
| 9,578,755 B2* | 2/2017 | Mizutani | H05K 3/429 | |
| 9,595,485 B2* | 3/2017 | Vincent | H01L 25/50 | |
| 9,673,150 B2* | 6/2017 | Gong | H01L 24/97 | |
| 9,892,989 B1* | 2/2018 | Ho | H01L 23/3192 | |
| 2005/0258522 A1* | 11/2005 | En | C23G 1/10 | 257/670 |
| 2009/0205859 A1* | 8/2009 | Tanaka | H01L 24/82 | 174/260 |
| 2011/0278736 A1* | 11/2011 | Lin | H01L 25/50 | 257/774 |
| 2012/0049700 A1* | 3/2012 | Cochrane | H05K 9/0049 | 312/223.2 |
| 2012/0112351 A1* | 5/2012 | Walczyk | H01L 21/78 | 257/772 |
| 2014/0103527 A1* | 4/2014 | Marimuthu | H01L 23/3121 | 257/737 |
| 2014/0191348 A1* | 7/2014 | Humbert | G01N 21/766 | 257/431 |
| 2014/0198089 A1* | 7/2014 | Lin | G09G 3/3611 | 345/212 |
| 2014/0264784 A1* | 9/2014 | Ho | H01L 23/552 | 257/659 |
| 2015/0115470 A1* | 4/2015 | Su | H01L 24/19 | 257/774 |
| 2015/0137338 A1* | 5/2015 | Lin | H01L 23/49816 | 257/676 |
| 2015/0271917 A1* | 9/2015 | Choi | H05K 3/429 | 174/251 |
| 2015/0279815 A1* | 10/2015 | Do | H01L 25/0655 | 257/737 |
| 2016/0276176 A1* | 9/2016 | Kamphuis | H01L 24/94 | |
| 2017/0200657 A1* | 7/2017 | Ho | H01L 22/14 | |
| 2017/0263572 A1* | 9/2017 | Gong | H01L 24/97 | |
| 2018/0025949 A1* | 1/2018 | Sohn | H01L 22/12 | 356/400 |
| 2018/0026023 A1* | 1/2018 | Lin | H01L 25/50 | |
| 2018/0076166 A1* | 3/2018 | Yu | H01L 21/56 | |

\* cited by examiner

US 10,211,071 B2

IC PACKAGING METHOD AND A PACKAGED IC DEVICE

Embodiments of the invention relate generally to electronic circuits and, more particularly, to Integrated Circuit (IC) devices and methods for packaging IC dies.

IC packaging or assembly processes generally involve enclosing IC chips in protective materials and providing electrical connections to IC chips. Conventional IC packaging techniques typically use metal shielding on outer surfaces of IC device packages for electrical connections. However, additional circuit areas used for electrical connection result in bigger package size. In addition, additional circuit areas used for electrical connection may hinder a subsequent plating process. Further, additional circuit areas used for electrical connection on outer surfaces of IC device packages may cause cosmetic issues.

Embodiments of a method for packaging Integrated Circuit (IC) dies and an IC device are described. In an embodiment, a method for packaging IC dies involves creating openings on a substrate, where side surfaces of the openings on the substrate are covered by metal layers, placing the IC dies into the openings on the substrate, applying a second metal layer to the substrate, where the IC dies are electrically connected to at least a portion of the second metal layer, and cutting the substrate into IC devices. Other embodiments are also described.

In an embodiment, the method further involves applying the metal layers to the side surfaces of the openings such that the metal layers on the side surfaces of the openings are in contact with a third metal layer on an upper surface of the substrate and with a fourth metal layer on a bottom surface of the substrate.

In an embodiment, each of the metal layers that are applied to the side surfaces of the openings and the second, third and fourth metal layers comprises copper (Cu).

In an embodiment, the method further involves applying a tape layer to the fourth metal layer on the bottom surface of the substrate before placing the IC dies into the openings on the substrate.

In an embodiment, the method further involves applying a film layer and a fifth metal layer to the substrate after placing the IC dies into the openings on the substrate.

In an embodiment, the method further involves removing the tape layer after applying the film layer and the fifth metal layer to the substrate.

In an embodiment, the method further involves applying ultraviolet (UV) lasers to create a first set of openings on the fifth metal layer.

In an embodiment, the method further involves creating a second set of openings on the film layer such that a plurality of contact pads on the IC dies are exposed.

In an embodiment, the method further involves attaching a sixth metal layer to the fourth metal layer on the bottom surface of the substrate.

In an embodiment, applying the second metal layer to the substrate involves attaching the second metal layer to the fifth metal layer.

In an embodiment, the method further involves removing some portions of the second metal layer by photo patterning such that the contact pads on the IC die are electrically connected to the at least the portion of the second metal layer.

In an embodiment, the method further involves depositing solder mask layers on opposite sides of the substrate.

In an embodiment, cutting the substrate into the IC devices involves cutting the substrate using saw blades into Quad Flat No-lead (QFN) devices.

In an embodiment, the method further involves depositing metal contacts onto the substrate, and wherein cutting the substrate into the IC devices comprises cutting the substrate using saw blades into ball grid array (BGA) devices.

In an embodiment, a method for packaging IC dies involves creating openings on a substrate, sputtering a metal material to side surfaces of the openings such that the side surfaces of the openings are electronically connected to metal layers attached to an upper surface and a bottom surface of the substrate, placing the IC dies into the openings on the substrate, applying a second metal layer to the substrate, where the IC dies are electrically connected to at least a portion of the second metal layer, and cutting the substrate into IC devices.

In an embodiment, the method further involves applying a tape layer to a third metal layer attached to the bottom surface of the substrate before placing the IC dies into the openings on the substrate, applying and laminating a film layer and a fourth metal layer to the substrate after placing the IC dies into the openings on the substrate, and removing the tape layer after applying and laminating the film layer and the fourth metal layer to the substrate In an embodiment, the method further involves comprising applying ultraviolet (UV) lasers to create a plurality of openings on the fourth metal layer and the film layer such that a plurality of contact pads on the IC dies are exposed.

In an embodiment, an IC device includes a substrate having an opening, an IC die that is located within the opening of the substrate, a first metal layer attached to a bottom surface of the substrate, a second metal layer attached to an upper surface of the substrate, where a side surface of the opening is covered by a third metal layer that is in contact with the first and second metal layers, a film layer that surrounds the IC die, a fourth metal layer that is electrically connected to the second metal layer and a contact pad of the IC die, a first solder mask layer attached to the first metal layer, and a second solder mask layer attached to the film layer and the fourth metal layer.

In an embodiment, the IC device further includes metal contacts connected to contact pads of the IC die.

In an embodiment, the first, second, third and fourth metal layer comprise copper (Cu).

Other aspects and advantages of embodiments of the present invention will become apparent from the following detailed description, taken in conjunction with the accompanying drawings, depicted by way of example of the principles of the invention.

Throughout the description, similar reference numbers may be used to identify similar elements.

It will be readily understood that the components of the embodiments as generally described herein and illustrated in the appended figures could be arranged and designed in a wide variety of different configurations. Thus, the following detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment. Rather, language referring to the features and advantages is understood to mean that a specific feature, advantage, or characteristic described in connection with an embodiment is included in at least one embodiment. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment. Thus, the phrases "in one embodiment," "in an embodiment," and similar language throughout this specification may, but do not necessarily, all refer to the same embodiment.

Figure 1:
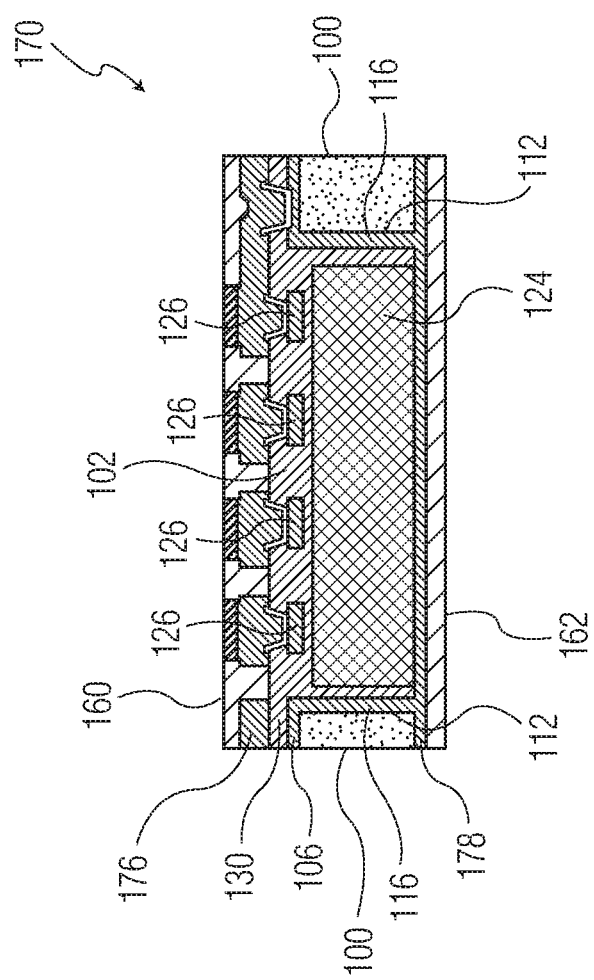
FIG. 1 depicts an IC device that is packaged using an IC packaging process in accordance with an embodiment of the invention.

FIG. 1 depicts an IC device 170 that is packaged using an IC packaging process in accordance with an embodiment of the invention. In the embodiment depicted in FIG. 1, the IC device includes a substrate 100 having an opening 102, an IC die 124 that is located within the opening of the substrate, a metal layer 178 attached to a bottom surface of the substrate, a metal layer 106 attached to an upper surface of the substrate, a film layer 130 that surrounds the IC die, a metal layer 176 that is electrically connected to the metal layer 106 and a contact pad 126 of the IC die, a first solder mask layer 162 attached to the metal layer 178 and a second solder mask layer 160 attached to the film layer and the metal layer 176. Each of the metal layers 176, 178 may include multiple metal layers. In the embodiment depicted in FIG. 1, the side surface 112 of the opening is covered by a metal layer 116 that is in contact with the metal layers 106, 178.

As previously described, traditional IC packaging techniques typically use metal shielding on outer surfaces of IC device packages for electrical connection, which results in bigger package size, hinder a subsequent plating process and cause cosmetic issues. Compared with traditional IC chip packaging techniques, embodiments of the present invention use the metal layer 216 attached to the side surface 112 of the opening 102 to provide an electrical connection within the packaged IC device 170. Consequently, compared with traditional IC chip packaging techniques, embodiments of the present invention produce packaged IC devices with smaller dimensions (e.g., thinner IC packages). In addition, compared with traditional IC chip packaging techniques, embodiments of the present invention do not require an extra process for shielding. Furthermore, embodiments of the present invention provide six-side protection for the IC die. Additionally, the metal layer 178 attached to the IC die 124 can be used as a heat sink for the IC die, which can lower the IC die temperature. Further, compared with traditional IC chip packaging techniques, embodiments of the present invention reduce or even eliminate the usage of wire bonds.

Figure 2:
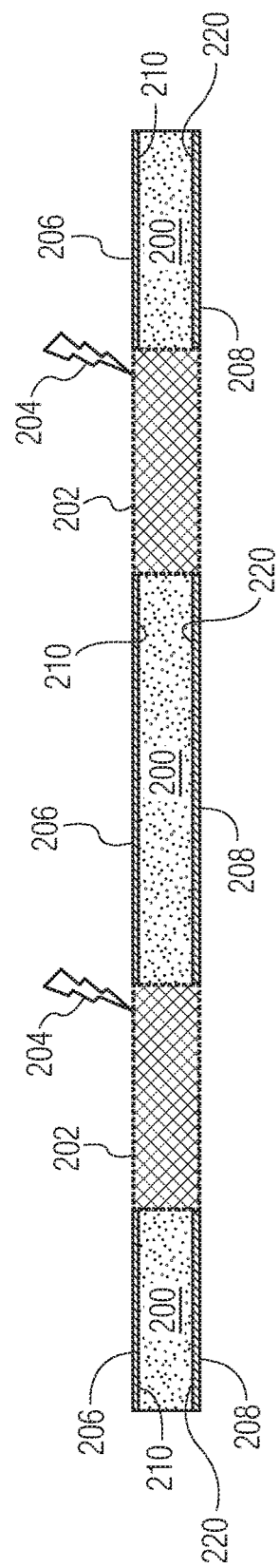
FIG. 2 depicts a step of an IC packaging process in which openings are created on a substrate.

An IC packaging process in accordance with an embodiment of the invention is described with reference to FIGS. 2-22. In particular, FIG. 2 depicts a step of the IC packaging process in which openings 202 are created on a substrate 200. In the opening creation step depicted in FIG. 2, ultraviolet (UV) lasers 204 are applied to the substrate to create the openings. The openings can be created using other methods, such as etching. In the embodiment depicted in FIG. 2, metal layers 206, 208 (e.g., copper (Cu) foils) are attached to the upper surface 210 and the bottom surface 220 of the substrate, respectively. In some embodiments, the substrate with metal layers is obtained from a manufacturer.

In some embodiments, prior to the opening creation step depicted in FIG. 2, metal layers are deposited onto the upper surface and the bottom surface of the substrate, which is obtained from a manufacturer.

Figure 3:
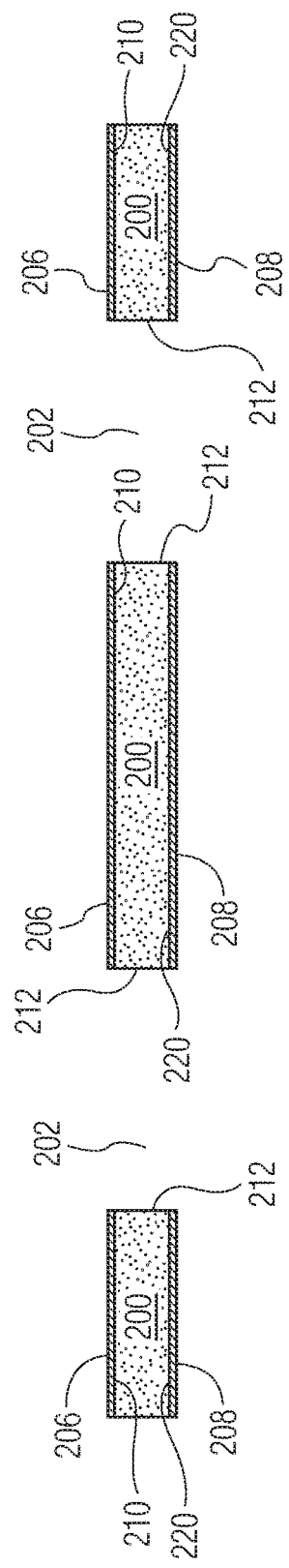
FIG. 3 is a cross-sectional view of the substrate after the opening creation step of the IC packaging process depicted in FIG. 2.

FIG. 3 is a cross-sectional view of the substrate 200 after the opening creation step of the IC packaging process depicted in FIG. 2. In the embodiment depicted in FIG. 3, the openings 202 have been created on the substrate. Each opening has side surfaces 212 that are exposed between the metal layers 206, 208. Although FIG. 3 shows two openings on the substrate, the number of openings created by the opening creation step may be more than two. In some embodiments, the number of openings created by the opening creation step can be in the range of tens or hundreds.

Figure 4:
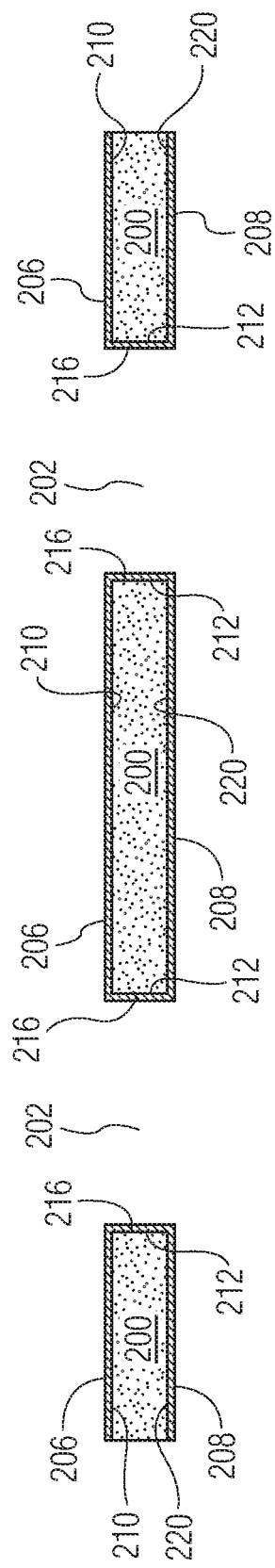
FIG. 4 depicts a step of the IC packaging process in which side surfaces of the openings on the substrate are covered by metal layers.

FIG. 4 depicts a step of the IC packaging process in which the side surfaces 212 of the openings 202 on the substrate 202 are covered by metal layers 216. In the metal covering step depicted in FIG. 4, metal layers (e.g., copper (Cu) foils) are applied to the side surfaces of the openings on the substrate. Metal layers can be applied to the side surfaces of openings on the substrate using different methods. In an embodiment, a metal material (e.g., Cu) is sputtered, sprayed or spread on the side surfaces of the openings on the substrate. In another embodiment, metal layers are attached to (e.g., glued onto) the side surfaces of the openings on the substrate. In the embodiment depicted in FIG. 4, the metal layers 216 on the side surfaces of the openings are in contact with the metal layers 206, 208 on the upper surface 210 and the bottom surface 220 of the substrate. Consequently, the metal layers on the upper surface and the bottom surface of the substrate are electrically connected through the metal layers 216 on the side surfaces of the openings.

Figure 5:
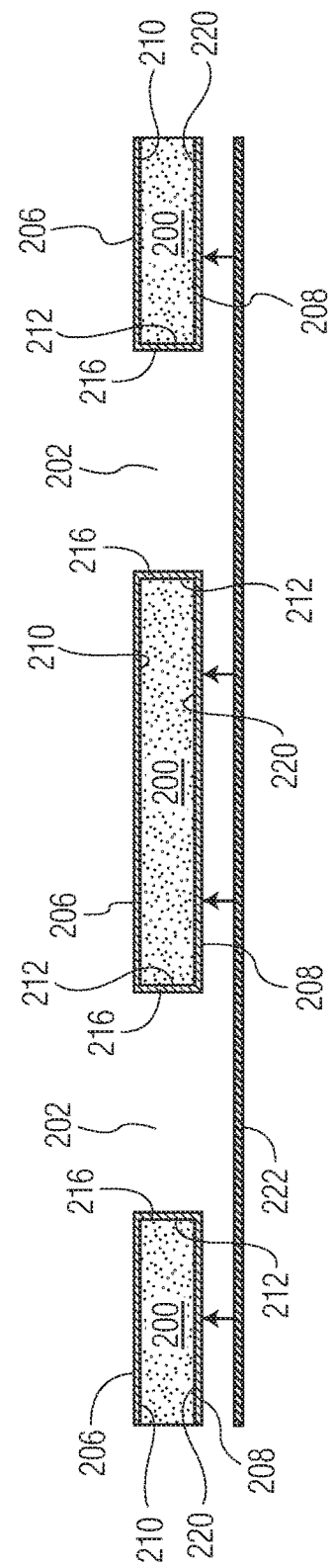
FIG. 5 depicts a step of the IC packaging process in which a tape layer is applied to the substrate.

FIG. 5 depicts a step of the IC packaging process in which a tape layer 222 is applied to the substrate. In the tape application step depicted in FIG. 5, the tape layer is being attached to the metal layer 208 on the bottom surface 220 of the substrate. In some embodiments, the metal covering step depicted in FIG. 4 is performed concurrently with the tape application step depicted in FIG. 5.

Figure 6:
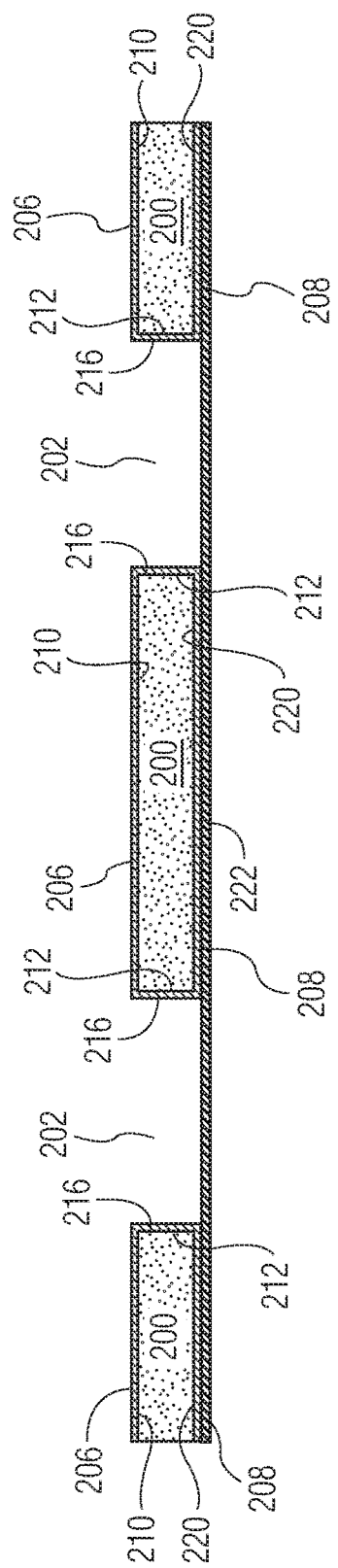
FIG. 6 is a cross-sectional view of the substrate after the tape application step of the IC packaging process depicted in FIG. 5.

FIG. 6 is a cross-sectional view of the substrate 200 after the tape application step of the IC packaging process depicted in FIG. 5. In the embodiment depicted in FIG. 6, the tape layer 222 has been attached to the metal layer 208. The tape layer provides structural (i.e., mechanical) support for the substrate during subsequent IC packaging process steps. The tape layer can be removed (e.g., peeled off) in a later stage of IC packaging. In some embodiments, the tape layer can be made of thermo-release tape, which loses adhesion in response to the application of heat.

Figure 7:
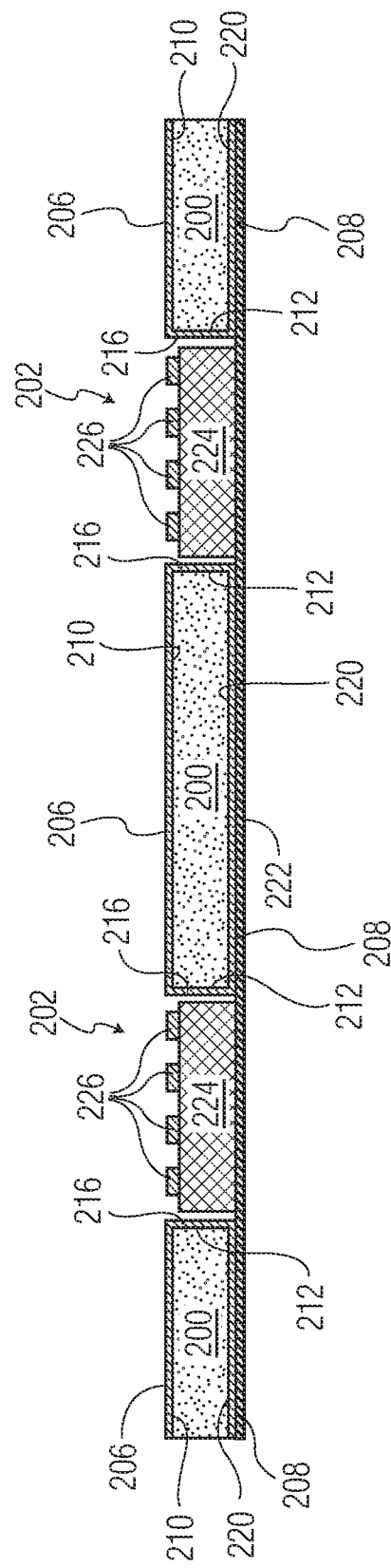
FIG. 7 is a cross-sectional view of the substrate after a die placement step of the IC packaging process.

After the tape application step depicted in FIG. 5, IC dies 224 are placed into the openings 202 on the substrate 200 in a die placement step of the IC packaging process. FIG. 7 is a cross-sectional view of the substrate after the die placement step of the IC packaging process. In the embodiment depicted in FIG. 6, the IC dies with contact pads 226 have been positioned in the openings on top of the tape layer 222.

Figure 8:
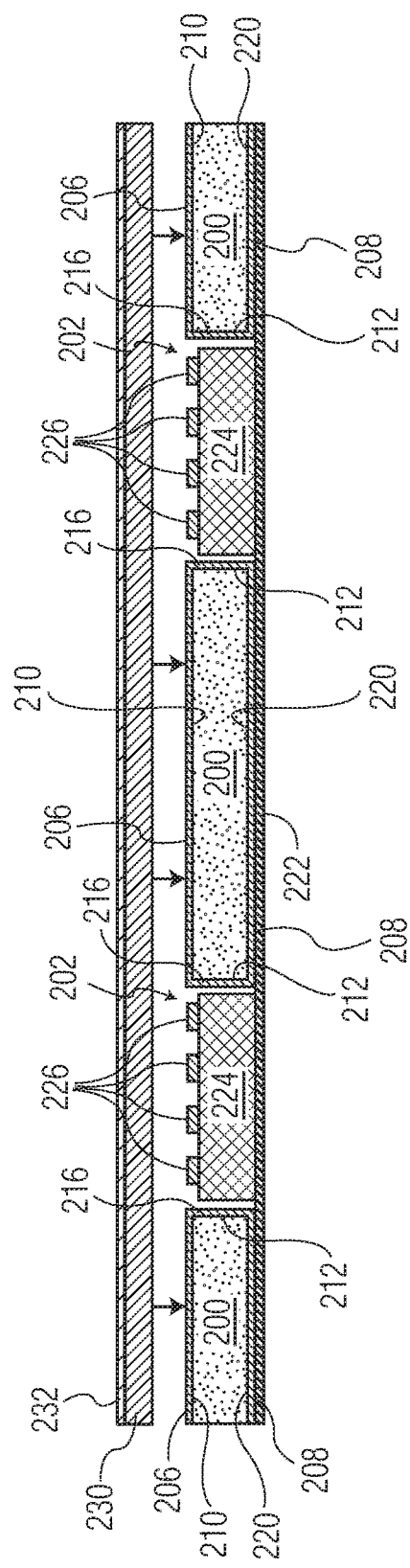
FIG. 8 depicts a step of the IC packaging process in which a film layer and a metal layer are applied to the substrate.

FIG. 8 depicts a step of the IC packaging process in which a film layer 230 and a metal layer 232 (i.e., stacked layers) are applied to the substrate 200. In the stacked-layer application step depicted in FIG. 8, the film layer, which may be a resin layer or other type of film, and the metal layer 232 (e.g., a Cu foil layer) on top of the film layer are being attached to the metal layer 206.

Figure 9:
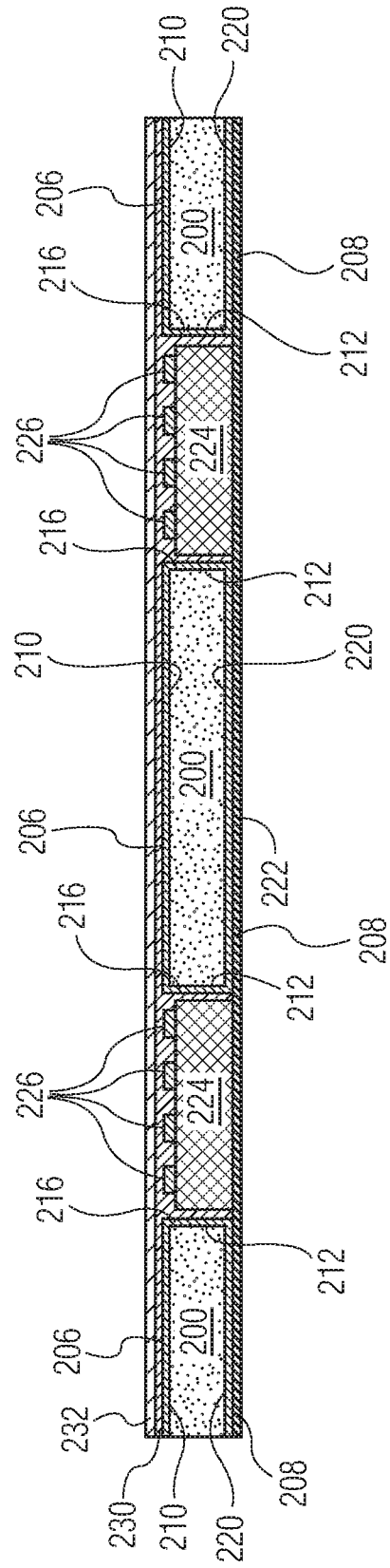
FIG. 9 is a cross-sectional view of the substrate after a lamination step of the IC packaging process.

After the stacked layers application step depicted in FIG. 8, heat is applied to the substrate 200 in a lamination step of the IC packaging process. FIG. 9 is a cross-sectional view of the substrate after the lamination step of the IC packaging process. In the embodiment depicted in FIG. 9, the empty space between the IC dies 224 and the openings 202 have been filled by the resin layer 230, which forms a pad layer between the substrate and the Cu foil layer 232.

Figure 10:
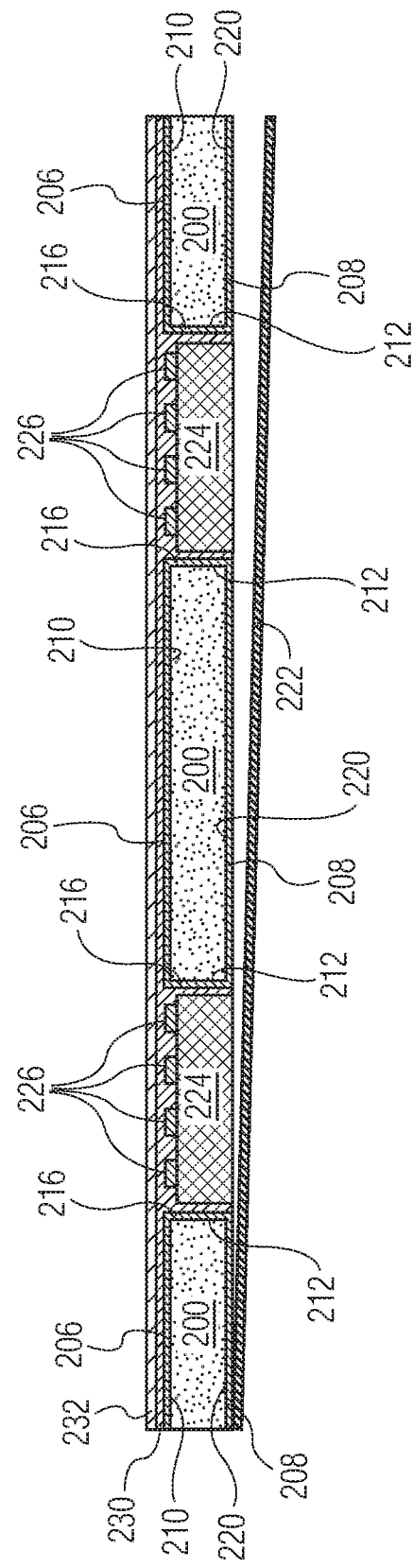
FIG. 10 depicts a step of the IC packaging process in which the tape layer is removed from the substrate.

FIG. 10 depicts a step of the IC packaging process in which the tape layer 222 is removed from the substrate 200. In the de-taping step depicted in FIG. 10, the tape layer is detached from the metal layer 208 at the bottom surface 220 of the substrate by force or by heat.

Figure 11:
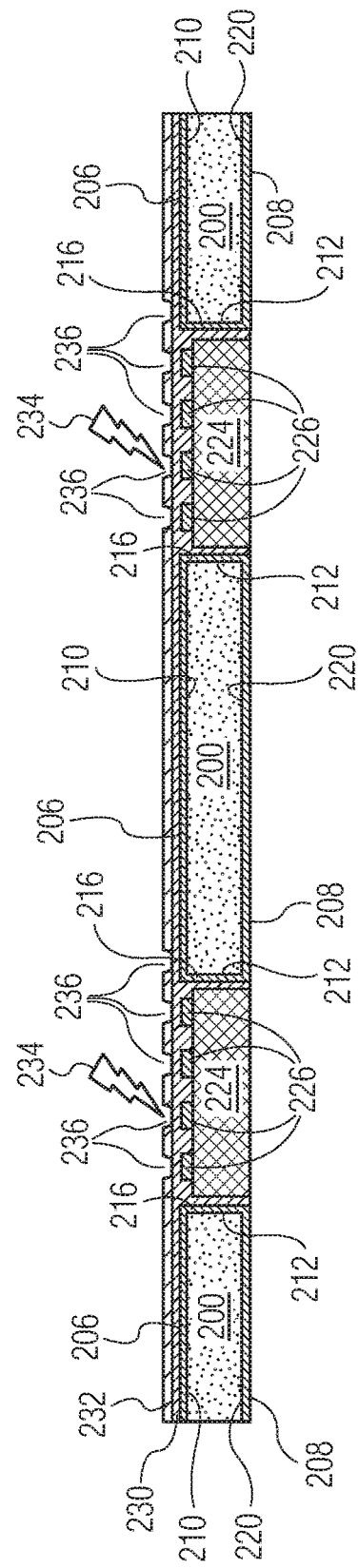
FIG. 11 depicts a step of the IC packaging process in which some portions of the top metal layer is removed.

FIG. 11 depicts a step of the IC packaging process in which some portions of the top Cu layer 232 is removed. In the etching step depicted in FIG. 11, ultraviolet (UV) lasers 234 are applied to the substrate to remove some portions of the top metal layer to create openings or gaps 236 on the metal layer. The openings on the metal layer can be created using other methods, such as etching.

Figure 12:
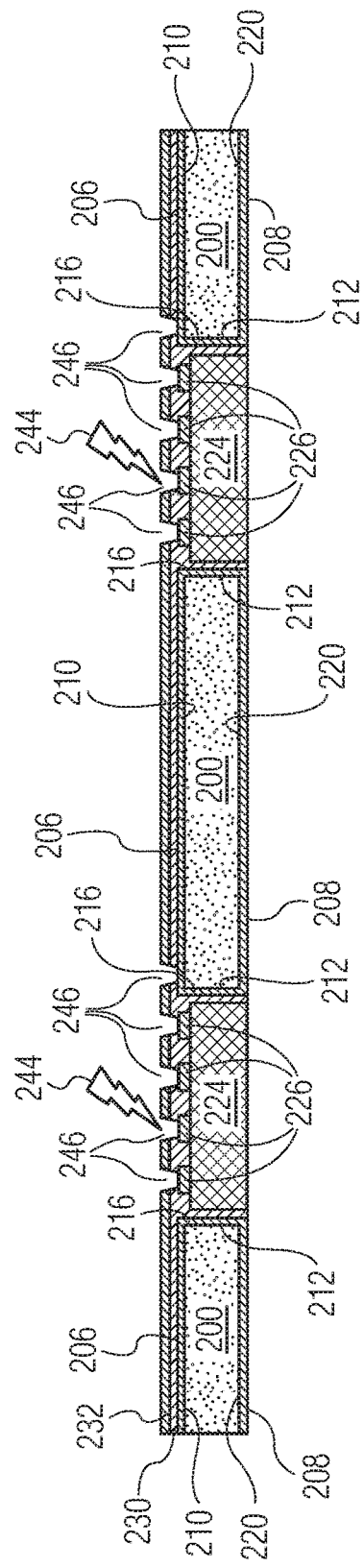
FIG. 12 depicts a desmear step of the IC packaging process in which some portions of the film layer is removed.

FIG. 12 depicts a desmear step of the IC packaging process in which some portions of the resin layer 230 are removed. In the desmear step depicted in FIG. 13, lasers 244 are applied to the substrate 200 while gas (e.g., $CO_2$) is supplied to remove some portions of the resin layer such that the contact pads 226 of the IC dies 224 are exposed through openings 246.

Figure 13:
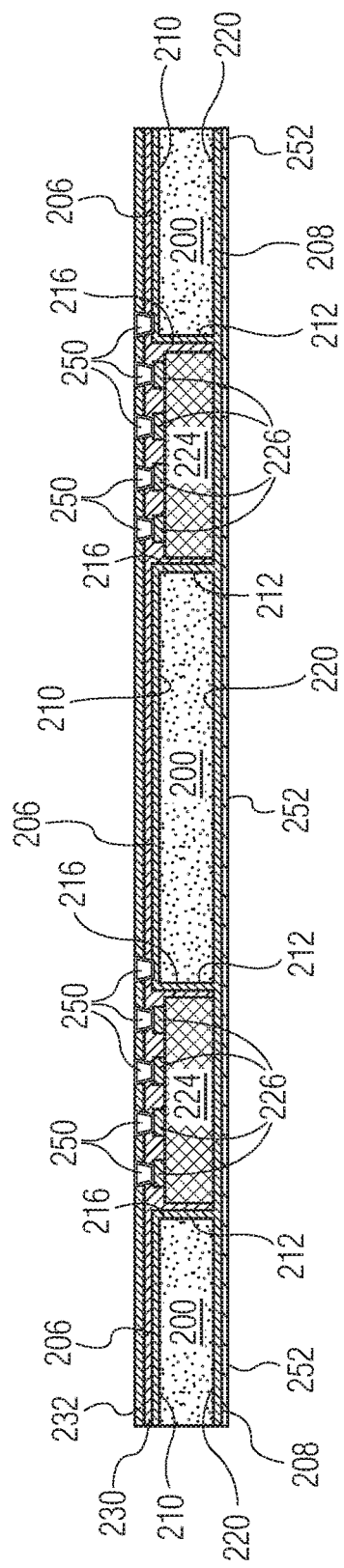
FIG. 13 is a cross-sectional view of the substrate after a metal sputter step of the IC packaging process.

After the desmear step depicted in FIG. 12, metal layers are attached to the substrate 200 and the openings 246 in a metal sputter step. FIG. 13 is a cross-sectional view of the substrate after the metal sputter step of the IC packaging process. In the embodiment depicted in FIG. 13, a Cu layer 252 has been sputtered onto the bottom surface 220 of the substrate and Cu has been sputtered into gaps between the top metal layer 232 and the contact pads 226 of the IC dies 224 or the metal layer 206 to create plugs 250.

Figure 14:
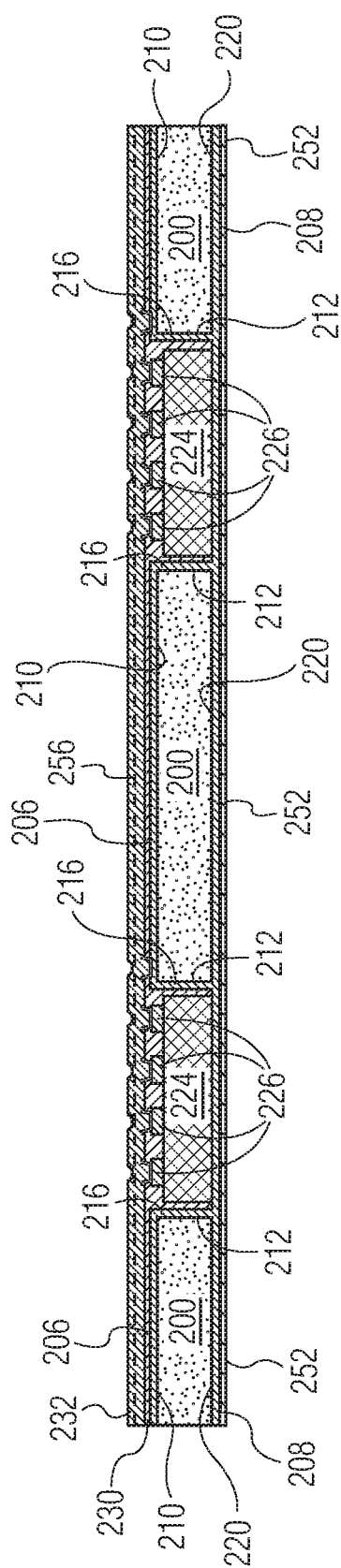
FIG. 14 is a cross-sectional view of the substrate after a metal planting step of the IC packaging process.

After the metal sputter step, a metal layer 256 is attached to the substrate 200 in a metal planting step. FIG. 14 is a cross-sectional view of the substrate after the metal planting step of the IC packaging process. In the embodiment depicted in FIG. 14, a Cu layer 256 has been sputtered onto the top Cu layer 232 of the substrate.

Figure 15:
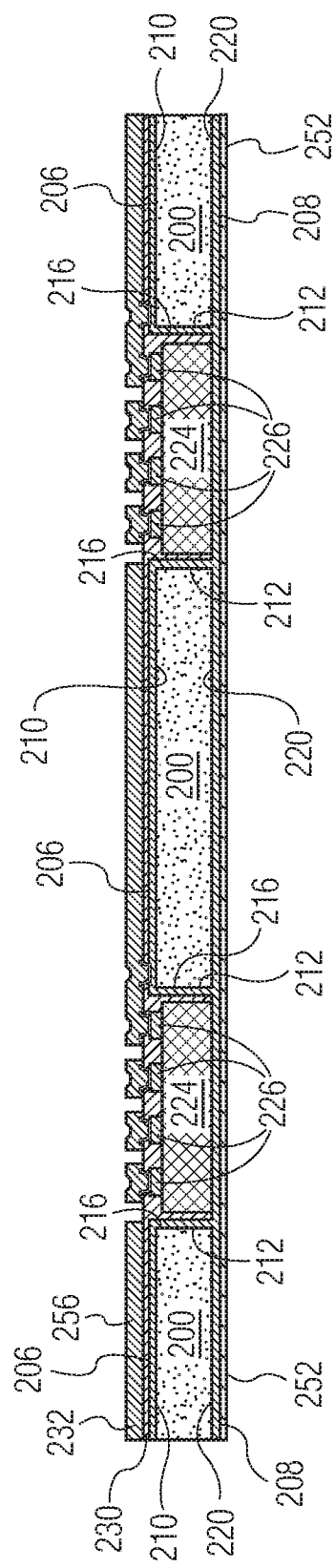
FIG. 15 is a cross-sectional view of the substrate after a photo patterning step of the IC packaging process.

After the metal planting step, some portions of the Cu layers 232, 256 on the substrate 200 are etched away in a photo patterning step. FIG. 15 is a cross-sectional view of the substrate after the photo patterning step of the IC packaging process. In the embodiment depicted in FIG. 15, some portions of the Cu layers on top of the openings 202 have been removed through photo patterning such that the resin layer 230 is exposed.

Figure 16:
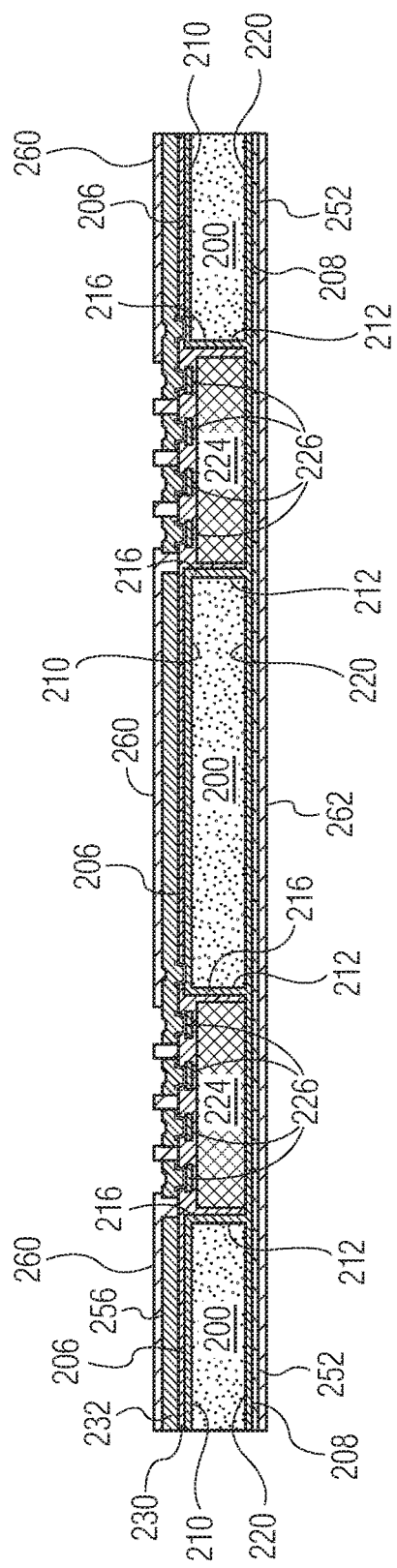
FIG. 16 is a cross-sectional view of the substrate after a solder mask deposition step of the IC packaging process.

After the photo patterning step, solder mask layers 260, 262 are attached to the substrate 200 in a solder mask deposition step. FIG. 16 is a cross-sectional view of the substrate after the solder mask deposition step of the IC packaging process. In the embodiment depicted in FIG. 16, a first solder mask layer 260 has been deposited onto the top of the substrate and a second solder mask layer 262 has been attached to the bottom of the substrate.

Figure 17:
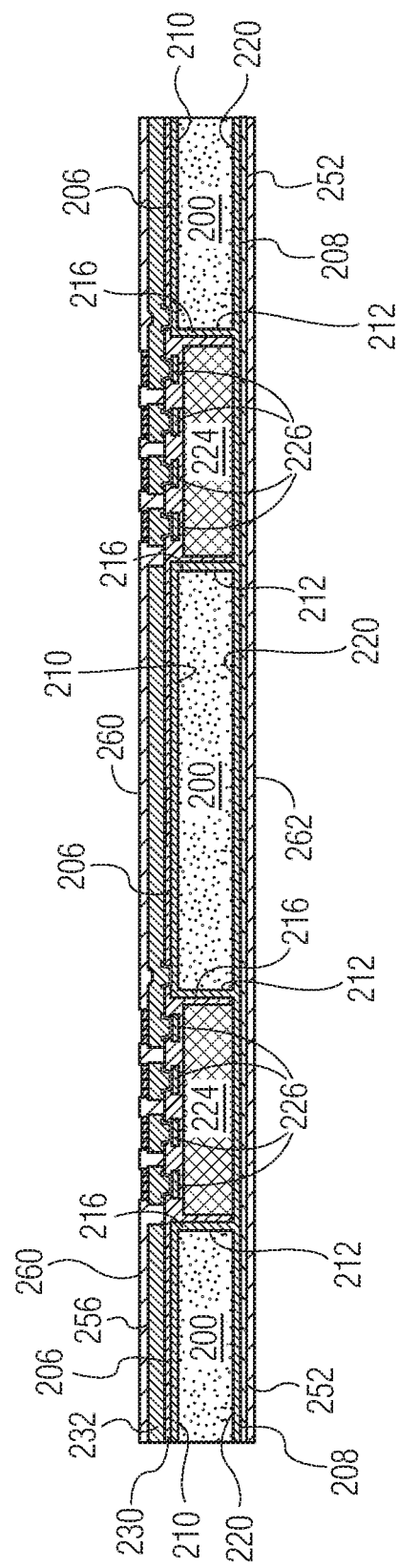
FIG. 17 is a cross-sectional view of the substrate after a surface finishing step of the IC packaging process.

After the solder mask deposition step, the substrate 200 is processed in a surface finishing step. FIG. 17 is a cross-sectional view of the substrate after the surface finishing step of the IC packaging process. In the embodiment depicted in FIG. 17, the surface of the metal layer 256 that is in contact with the contact pads 226 of the IC dies 224 is processed with an Electroless nickel immersion gold (ENIG) finish or an Organic Solderability Preservative (OSP) finish.

Figure 18:
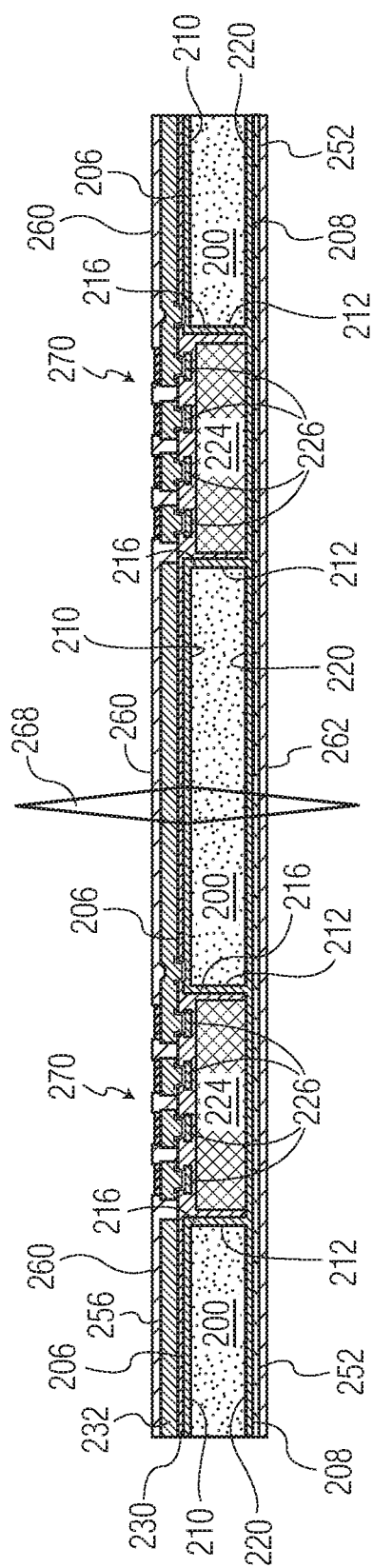
FIG. 18 depicts a cutting step of the IC packaging process in which the substrate is cut into separate IC devices with each individual unit being referred to as a packaged IC device.

FIG. 18 depicts a cutting step of the IC packaging process in which the substrate 200 is cut into separate IC devices 270 with each individual unit being referred to as a packaged IC device. In the cutting step depicted in FIG. 18, the substrate is cut into IC devices (e.g., Quad Flat No-lead (QFN)

devices) using at least one saw blade 268. The substrate can be cut into individual IC devices by other methods, such as laser cutting. In an embodiment, the packaged IC devices are identical to each other.

Figure 19:
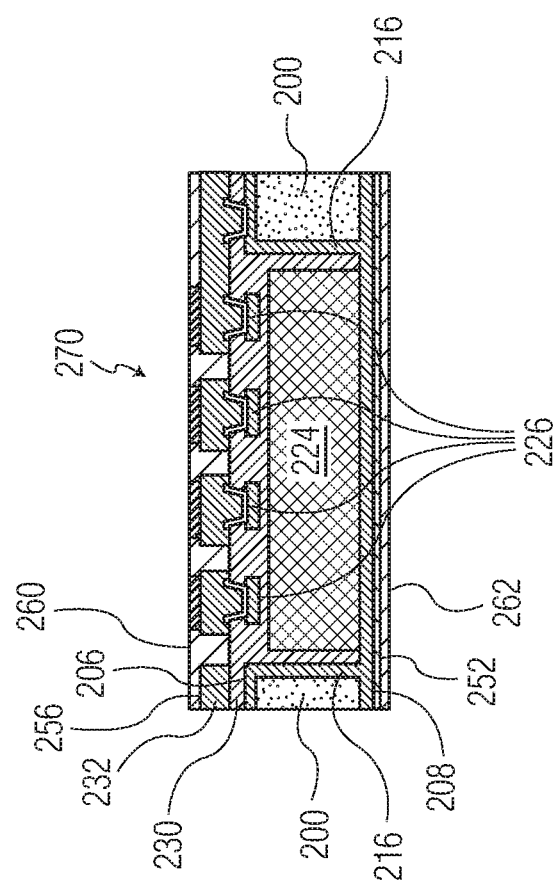
FIG. 19 depicts a packaged IC device that is generated by the cutting step depicted in FIG. 18.

FIG. 19 depicts a packaged IC device 270 that is generated by the cutting step depicted in FIG. 18. In the embodiment depicted in FIG. 19, the IC device includes the IC die 224, contact pads 226 that are connected to the IC die 224, the film layer 230 surrounding the IC die, metal layers 232, 256 above the IC die, the solder mask layer 260 above the metal layers 256, metal layers 208, 252 underneath the IC die, the solder mask layer 262 underneath the metal layer 252.

Figure 20:
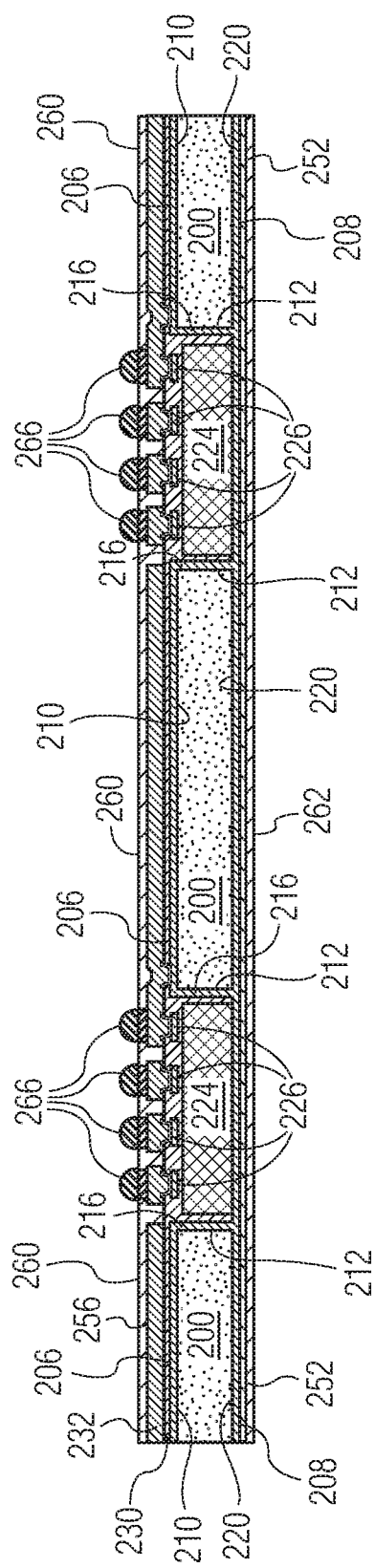
FIG. 20 is a cross-sectional view of the substrate after a ball deposition step of the IC packaging process.

In some embodiments, metal contacts are deposited onto the substrate to form a ball grid array (BGA) in a ball deposition step. FIG. 20 is a cross-sectional view of the substrate after the ball deposition step of the IC packaging process. In the embodiment depicted in FIG. 18, metal balls 266 have been deposited onto the gaps within the solder mask layer 260.

Figure 21:
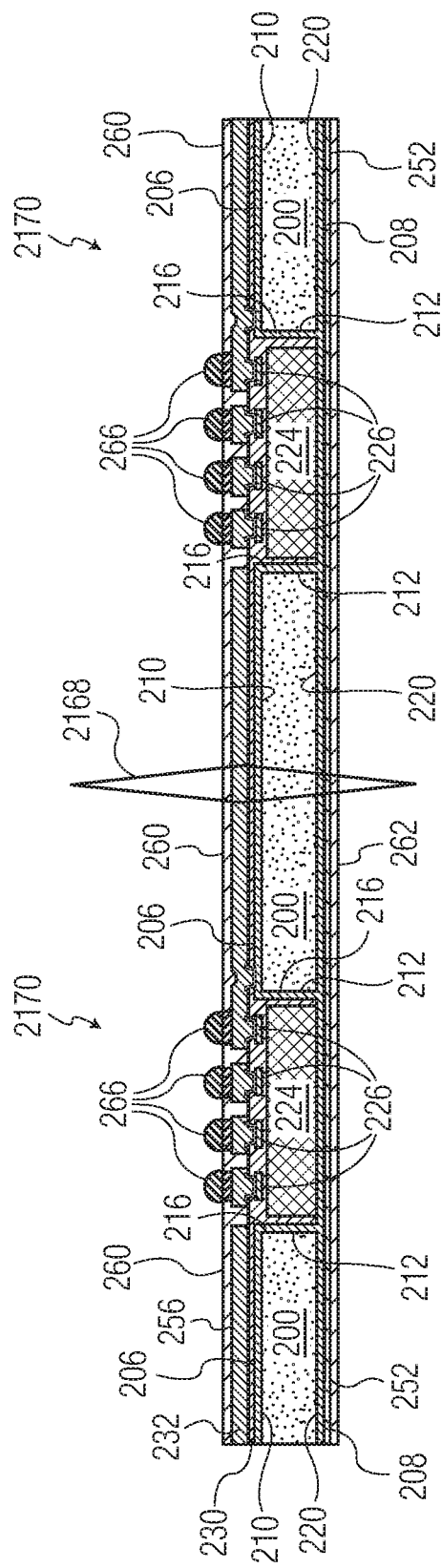
FIG. 21 depicts a cutting step of the IC packaging process in which the substrate is cut into IC devices.

FIG. 21 depicts a cutting step of the IC packaging process in which the substrate 200 is cut into IC devices. In the cutting step depicted in FIG. 21, the substrate 200 is cutting into IC devices (e.g., BGA devices) 2170 using saw blades 2168.

Figure 22:
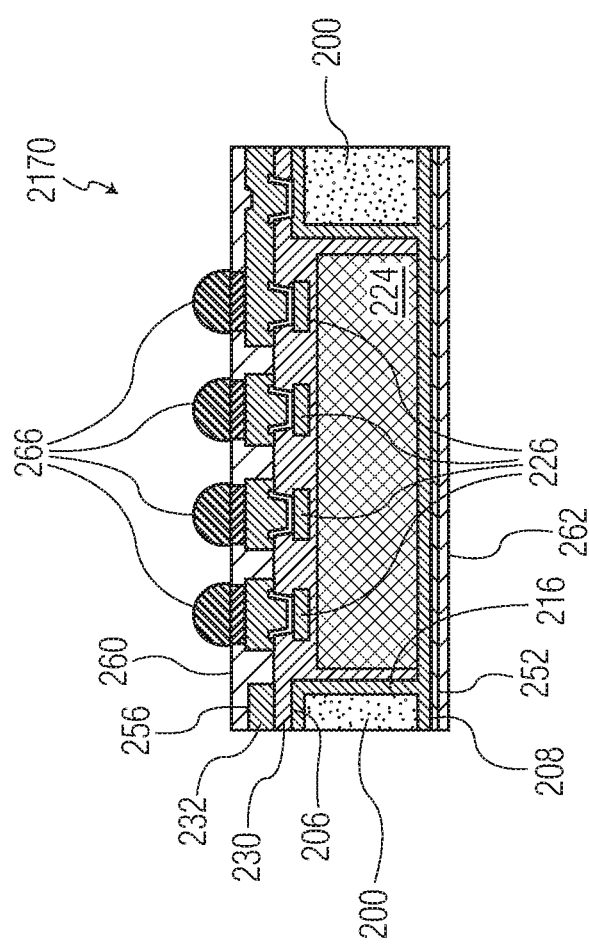
FIG. 22 depicts a ball grid array (BGA) device that is generated by the cutting step depicted in FIG. 21.

FIG. 22 depicts a BGA device 2170 that is generated by the cutting step depicted in FIG. 21. In the embodiment depicted in FIG. 22, the BGA device includes the IC die 224, contact pads 226 that are connected to the IC die 224, the film layer 230 surrounding the IC die, metal layers 232, 256 above the IC die, the solder mask layer 260 above the metal layers 256, contact balls 266, metal layers 208, 252 underneath the IC die, the solder mask layer 262 underneath the metal layer 252. Compared to the IC device 270 depicted in FIG. 19, the BGA device 2170 depicted in FIG. 22 includes the contact balls 266.

Figure 23:
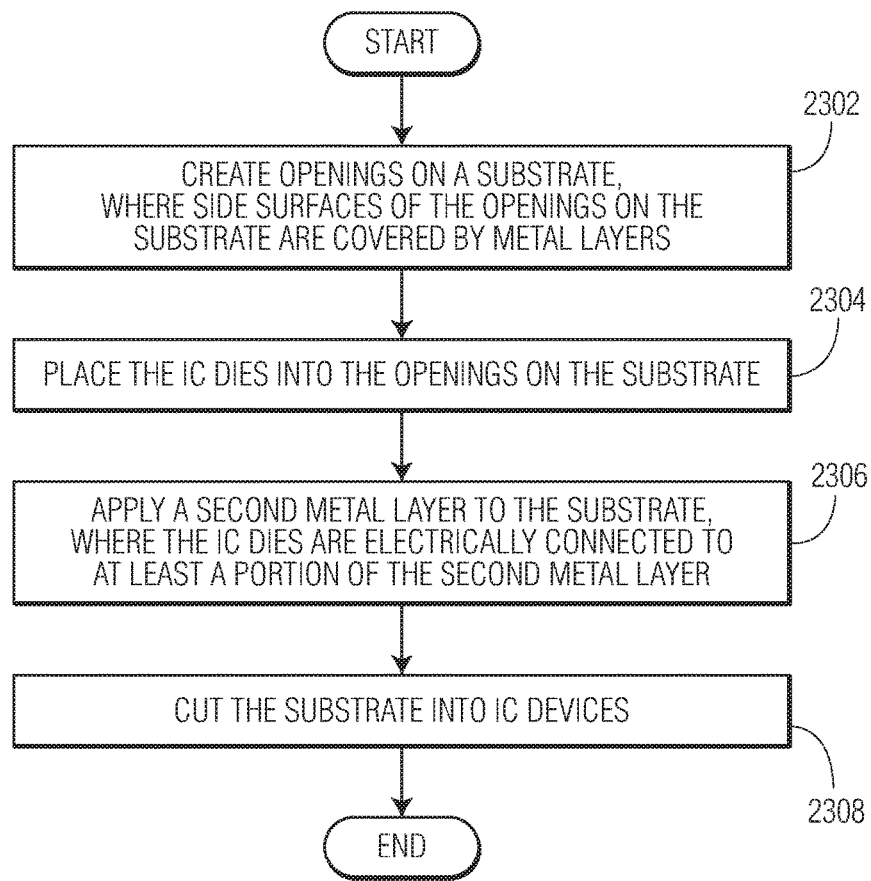
FIG. 23 is a process flow diagram of a method for packaging IC dies in accordance with an embodiment of the invention.

FIG. 23 is a process flow diagram of a method for packaging IC dies in accordance with an embodiment of the invention. At block 2302, openings are created on a substrate, where side surfaces of the openings on the substrate are covered by metal layers. At block 2304, the IC dies are placed into the openings on the substrate. At block 2306, a second metal layer is applied to the substrate, where the IC dies are electrically connected to at least a portion of the second metal layer. At block 2308, the substrate is cut into IC devices.

Although the operations of the method herein are shown and described in a particular order, the order of the operations of the method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

In addition, although specific embodiments of the invention that have been described or depicted include several components described or depicted herein, other embodiments of the invention may include fewer or more components to implement less or more feature.

Furthermore, although specific embodiments of the invention have been described and depicted, the invention is not to be limited to the specific forms or arrangements of parts so described and depicted. The scope of the invention is to be defined by the claims appended hereto and their equivalents.

What is claimed is:

1. A method for packaging Integrated Circuit (IC) dies, the method comprising:
    creating a plurality of openings on a substrate, wherein side surfaces of the openings on the substrate are covered by first metal layers and a top surface of the substrate is covered by a second metal layer;
    applying a tape layer to a bottom surface of the substrate;
    placing the IC dies into the openings on the substrate with a back side of each IC die on the tape layer, and contact pads of each IC die are positioned face-up in each opening;
    applying a third metal layer having an attached resin film to the top surface of the substrate and over the IC dies;
    removing portions of the third metal layer and the resin film to form gaps exposing the contact pads of the IC dies;
    applying metal in each of the gaps to create metal plugs on the contact pads of the IC dies;
    patterning the third metal layer around the metal plugs to form metal contacts that are electrically connected to the contact pads of the IC dies; and
    cutting the substrate into IC devices.

2. The method of claim 1, wherein the first metal layers on the side surfaces of the openings are in contact with the second metal layer on the top surface of the substrate and with a fourth metal layer that covers the bottom surface of the substrate.

3. The method of claim 2, wherein each of the first metal layers that are applied to the side surfaces of the openings and the second, third and fourth metal layers comprises copper (Cu).

4. The method of claim 2, wherein the tape layer is applied to the fourth metal layer on the bottom surface of the substrate before placing the IC dies into the openings on the substrate.

5. The method of claim 1, further comprising removing the tape layer after applying the third metal layer having the attached resin film to the top surface of the substrate.

6. The method of claim 1, wherein the patterning the third metal layer comprises:
    applying ultraviolet (UV) lasers to create a first set of openings on the third metal layer.

7. The method of claim 6, further comprising creating a second set of openings on the resin film such that the contact pads on the IC dies are exposed.

8. The method of claim 2, further comprising attaching a fifth metal layer to the fourth metal layer on the bottom surface of the substrate.

9. The method of claim 1, further comprising: attaching a sixth metal layer to a top surface of the third metal layer, after the metal plugs are formed and before the patterning to form metal contacts.

10. The method of claim 1, wherein the patterning further comprises: removing some portions of the third metal layer by photo patterning.

11. The method of claim 1, further comprising depositing solder mask layers on the top and bottom surfaces of the substrate.

12. The method of claim 1, wherein cutting the substrate into the IC devices comprises cutting the substrate using saw blades into Quad Flat No-lead (QFN) devices.

13. The method of claim 1, further comprising depositing contact balls onto the metal contacts, and wherein cutting the substrate into the IC devices comprises cutting the substrate using saw blades into ball grid array (BGA) devices.

14. The method of claim 1, further comprising:
removing at least one portion of the third metal layer and the resin film from the top surface of the substrate to form at least one gap exposing a portion of the second metal layer on the top surface of the substrate; and
applying metal in the at least one gap to create at least one metal contact to the second metal layer on the substrate.

15. The method of claim 1, further comprising:
depositing a solder mask around the metal contacts.

16. A method for packaging Integrated Circuit (IC) dies, the method comprising:
creating a plurality of openings on a substrate;
sputtering a metal material on the substrate such that first metal layers on side surfaces of the openings are electrically connected to a second metal layer on a top surface of the substrate and to a third metal layer on a bottom surface of the substrate;
placing the IC dies into the openings on the substrate with contact pads of each IC die positioned face-up;
applying a fourth metal layer having an attached resin film to the top surface of the substrate and over the IC dies;
forming metal contacts to the contact pads using the fourth metal layer, wherein the metal contacts are electrically connected to the contact pads of the IC dies; and
cutting the substrate into IC devices.

17. The method of claim 16, further comprising:
applying a tape layer to the third metal layer on the bottom surface of the substrate before placing the IC dies into the openings on the substrate;
and
removing the tape layer after applying the fourth metal and the resin film to the substrate.

18. The method of claim 16, wherein the forming metal contacts further comprises: applying ultraviolet (UV) lasers to create a plurality of openings on the fourth metal layer and the resin film such that the contact pads on the IC dies are exposed.

19. The method of claim 18, wherein the forming metal contacts further comprises: applying metal in the plurality of openings on the fourth metal layer to create metal plugs on the contact pads of the IC dies.

20. The method of claim 19, wherein the forming metal contacts further comprises: patterning the fourth metal layer around the metal plugs to form the metal contacts that are electrically connected to the contact.

* * * * *